United States Patent
Coletti et al.

(10) Patent No.: US 7,312,153 B2
(45) Date of Patent: Dec. 25, 2007

(54) TREATMENT OF SEMICONDUCTOR WAFERS

(75) Inventors: Stéphane Coletti, Saint Vincent de Mercuze (FR); Véronique Duquennoy-Pont, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 123 days.

(21) Appl. No.: 11/256,348

(22) Filed: Oct. 20, 2005

(65) Prior Publication Data

US 2006/0234507 A1 Oct. 19, 2006

(30) Foreign Application Priority Data

Apr. 15, 2005 (FR) ................................. 05 03781

(51) Int. Cl.
 *H01L 21/302* (2006.01)
(52) U.S. Cl. ................ 438/690; 438/745; 257/E21.219
(58) Field of Classification Search ................ 438/455, 438/690, 745; 257/E21.219
See application file for complete search history.

(56) References Cited

U.S. PATENT DOCUMENTS

| | | | | |
|---|---|---|---|---|
| 5,374,564 | A | 12/1994 | Bruel | 437/24 |
| 5,919,311 | A * | 7/1999 | Shive et al. | 134/1 |
| 6,312,797 | B1 | 11/2001 | Yokokawa et al. | 428/336 |
| 2003/0153162 | A1 | 8/2003 | Nakano et al. | 438/458 |
| 2004/0115905 | A1 | 6/2004 | Barge et al. | 438/473 |
| 2005/0020084 | A1 | 1/2005 | Richtarch | 438/692 |
| 2005/0218111 | A1* | 10/2005 | Maleville et al. | 216/33 |
| 2006/0054181 | A1* | 3/2006 | Rayandayan et al. | 134/1 |
| 2006/0138538 | A1 | 6/2006 | Ohmi et al. | 257/341 |
| 2006/0264343 | A1* | 11/2006 | Verhaverbeke et al. | 510/119 |
| 2006/0270242 | A1* | 11/2006 | Verhaverbeke et al. | 438/745 |
| 2006/0272677 | A1* | 12/2006 | Lee et al. | 134/3 |

FOREIGN PATENT DOCUMENTS

| | | |
|---|---|---|
| EP | 0 971 396 A1 | 1/2000 |
| EP | 1 302 985 A1 | 4/2003 |
| WO | WO 01/15215 A1 | 3/2001 |
| WO | WO 02/15244 A2 | 2/2002 |

OTHER PUBLICATIONS

A.J. Auberton-Heré et al, "Why Can Smart-Cut Change the Future of Microelectronics?", Int Journal of High Speed Electronics and Systems, vol. 10, No. 1, pp. 131-146.(2000).

* cited by examiner

*Primary Examiner*—Asok K. Sarkar
*Assistant Examiner*—Victor V. Yevsikov
(74) *Attorney, Agent, or Firm*—Winston & Strawn LLP

(57) ABSTRACT

A method is described for treating a wafer having at least a surface layer of semiconductor material, with the surface of this surface layer having undergone a chemical-mechanical polishing step followed by an RCA cleaning step. After the polishing step and prior to the RCA cleaning step, the method includes an intermediate step of cleaning the surface of the surface layer of semiconductor material using an SC1 solution under concentration and temperature conditions that allow the emergence of defects in the surface layer (curve B) to be reduced compared with a similar surface layer which has not undergone such an intermediate cleaning step (curve A).

15 Claims, 2 Drawing Sheets

TREATMENT OF SEMICONDUCTOR WAFERS

FIELD OF INVENTION AND BACKGROUND ART

The present invention relates to treating or cleaning the surface of a wafer in the form of a thin sheet having on its surface a layer of semiconductor material (e.g., silicon (Si) or silicon-germanium (SiGe)), such layer being termed a "useful layer", and constituting a medium from which large quantities of components (e.g., integrated circuit cells or discrete devices) can be produced.

One known technique for fabricating such wafers is the Smart Cut® technique, which can be used to obtain an SOI (silicon on insulator) wafer, for example. An example of carrying out the SMART-CUT® technique applied to the production of SOI wafers is described in U.S. Pat. No. 5,374,564 or in the article by A. J. Auberton-Hervé et al entitled "Why Can Smart-Cut Change the Future of Microelectronics?", Int Journal of High Speed Electronics and Systems, Vol 10, No 1, 2000, p 131-146. In general, the SMART-CUT® technique consists in implanting atomic species into an implantation zone beneath the face of a semiconductor wafer (e.g., Si or SiGe), in bringing the face of the wafer that has undergone implantation into intimate contact with a support substrate, and in cleaving the wafer at the implantation zone to transfer the portion of the wafer that is located between the implantation zone and the surface through which implantation has taken place onto the support substrate.

Thus, a structure (e.g., a SOI structure) is obtained having a layer that has been transferred onto one face of a support substrate. After cleavage and transfer, the surface of the transferred layer is treated to remove part of the thickness of the implanted layer and to reduce the roughness of the cleavage surface. Examples of such treatments are described in U.S. patent application US 2004/115905 and International patent application WO01/15215. Typically, the treatment comprises a polishing step followed by a cleaning step carried out prior to an optional final step of sacrificial oxidation and/or a smoothing heat treatment. The polishing step can reduce the root mean square (rms) roughness to less than 2.5 Angstroms (Å) (e.g., 2 Å rms) for a scan area (carried out using an atomic force microscope, for example) of 2 micrometers (μm) by 2 μm.

More precisely, in a first step, polishing comprises a chemical-mechanical polishing step employing a polishing plate associated with a polishing solution containing both an agent for chemically attacking the surface of the layer and abrasive particles for mechanically attacking the surface, and a washing step, generally using deionized water (DIW). Thereafter, a cleaning step is carried out, consisting in treating the wafers with cleaning solutions.

To clean the surfaces of wafers having a surface layer of semiconductor material, it is known to use a standard treatment known as "RCA" (because it was developed by Radio Corporation of America) and which comprises:

a first cleaning step using an SC1 solution (Standard Clean 1) (or APM, Ammonium-Hydrogen Peroxide Mixture); containing ammonium hydroxide ($NH_4OH$), hydrogen peroxide ($H_2O_2$), and deionized water ($H_2O$);

a second cleaning step using an SC2 solution (Standard Clean 2) (or (HPM, Hydrochloric Peroxide Mixture); containing hydrochloric acid (HCl), hydrogen peroxide ($H_2O_2$), and deionized water.

The first solution, SC1, generally comprises 5 parts by volume water ($H_2O$), 1 part by volume 27% ammonium hydroxide ($NH_4OH$), and 1 part by volume 30% hydrogen peroxide ($H_2O_2$) and is generally used in the temperature range of 50° C. to 80° C., is principally intended to remove particles isolated on the surface of the wafer and particles buried close to the surface, as well as to render the surface hydrophilic.

The second solution, SC2, generally used in the temperature range of 70° C. to 90° C., is principally intended to remove metallic contamination that has become deposited on the wafer surface, in particular by forming chlorides.

For thin structures, i.e., structures such as SOI structures having a semiconductor useful layer of thickness of less than about 1000 Å, "HF" defect densities have been observed in the final products (i.e., after final sacrificial oxidation) which exceed the acceptable limits. "HF" defects are defects in the active semiconductor layer of the SOI structure that extend from the surface of the layer right into the buried oxide layer; their presence can be revealed by a ring pattern after treating the SOI structure with hydrofluoric acid (HF). The HF defect density observed for certain wafers may be as high as 15 defects per square centimeter ($cm^2$), while the recommended limit value is typically of the order of 0.5 defects per $cm^2$, or even less than 0.1 defects per $cm^2$.

HF defects are considered to be "destructive" defects for wafers, since they render them non viable (i.e., of unacceptable quality) for subsequent treatments, in particular for component formation. Thus, there is a need for cleaning procedures that reduce the number of HF defects in the final product.

SUMMARY OF THE INVENTION

The invention proposes a technical solution for layers of semiconductor material that have undergone a chemical-mechanical polishing step and an RCA cleaning step which can reduce the influence of the treatments on the emergence of HF defects, in particular during subsequent treatments, and as a result can reduce the HF defect density in the layers.

This solution is achieved by a method of treating a wafer having at least a surface layer of semiconductor material, the surface of the surface layer having undergone a chemical-mechanical polishing step followed by an RCA cleaning step, in which method, after the polishing step and prior to the RCA cleaning step, implements an intermediate step of cleaning the surface of the surface layer of semiconductor material using an SC1 solution under concentration and temperature conditions that allow the subsequent emergence of defects (HF defects) to be reduced compared with a similar surface layer which has not undergone the intermediate cleaning step.

As is described in detail below, it has been found that the HF defect density emerging during subsequent treatments (e.g., sacrificial oxidation) is much lower in a surface layer that has undergone an intermediate cleaning step in accordance with the invention than in a similar layer that has not undergone the step (i.e., having only undergone the polishing step and the RCA cleaning step). Without the intermediate cleaning step, defects form in the surface layer by preferential etching in the region of polishing contaminants or residues. The defects may be defects emerging on the surface of the layer; these are thus already HF defects. When the defects do not emerge, they may become emergent defects and, as a result, HF defects, during subsequent treatments such as during thinning by sacrificial oxidation, for example, which may transform a non emergent defect into an emergent defect as thinning is "conformal", i.e., material removal is constant over the surface regardless of the initial thickness.

In one aspect of the invention, the SC1 solution comprises 1 volume of ammonium hydroxide ($NH_4OH$), 4 volumes of hydrogen peroxide ($H_2O_2$), and 10 to 40 volumes of deionized water ($H_2O$), the SC1 solution being used at a temperature of less than 50° C.

As an example, the SC1 solution may comprise 1 volume of ammonium hydroxide ($NH_4OH$), 4 volumes of hydrogen peroxide ($H_2O_2$), and 20 volumes of deionized water ($H_2O$) and be used at a temperature of 20° C.±5° C.

The intermediate cleaning step may be carried out by immersing a wafer having the semiconductor useful layer in an SC1 solution.

In a variation, the cleaning step is carried out using a polishing unit comprising a polishing head holding the wafer, the surface of the surface layer of semiconductor material of the wafer also being held in contact with a plate, the polishing unit including an injection line via which the SC1 solution is dispensed.

The surface layer of semiconductor material is preferably less than 1000 Å thick, is generally formed from silicon (Si) or silicon-germanium (SiGe) and optionally constitutes the surface layer of an SOI or SGOI (SiGe on insulator) structure respectively fabricated using the SMART-CUT® technique.

The present invention also provides a wafer having at least a surface layer of semiconductor material, the surface layer having a thickness of less than 1000 Å, a roughness of less than 2.5 Å rms for a scan area of 2 µm×2 µm, and an HF defect density of less than $0.5/cm^2$, or even less than $0.1/cm^2$. The wafer may be a silicon on insulator (SOI) structure.

BRIEF DESCRIPTION OF THE DRAWING FIGURES

DETAILED DESCRIPTION OF THE PREFERRED EMBODIMENTS

Figure 1:
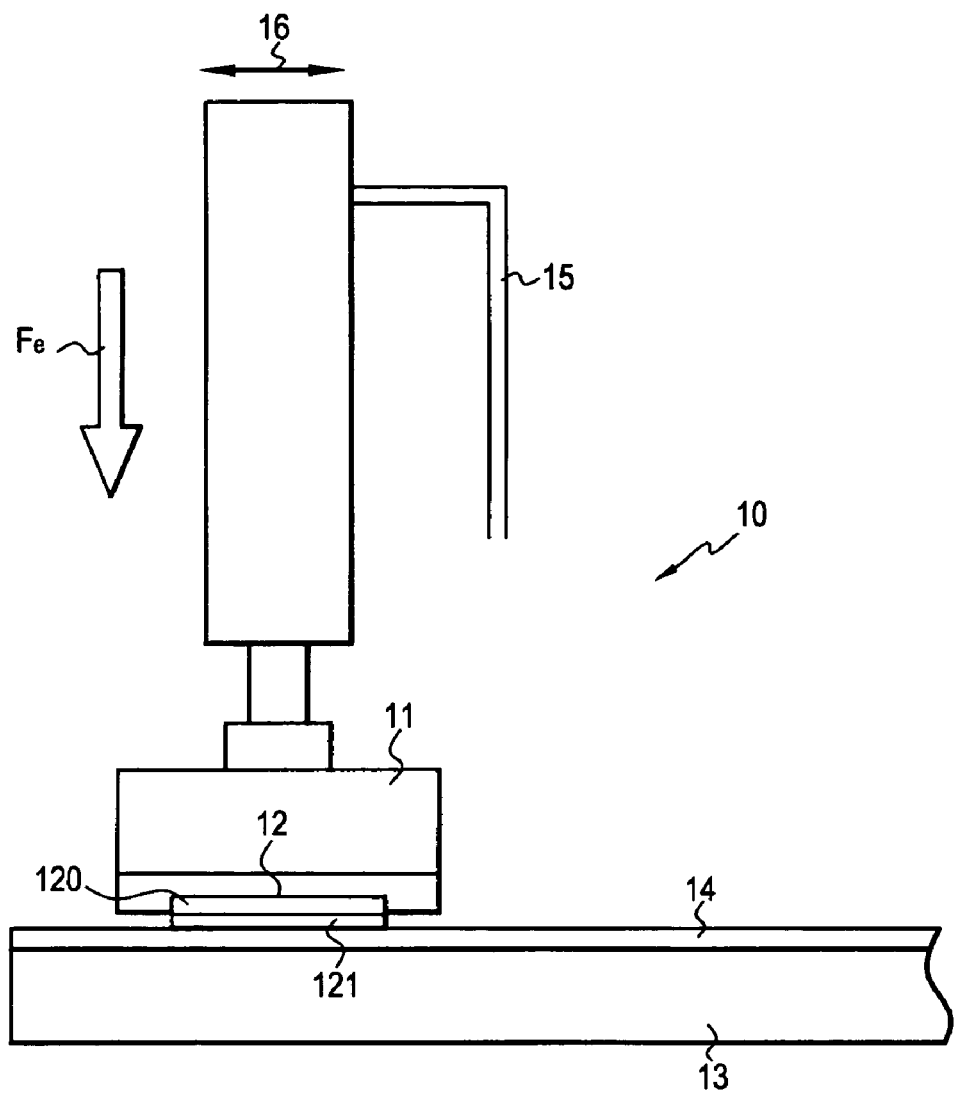
FIG. 1 is a diagram of a polishing unit employed to carry out the intermediate cleaning step of the invention.

The present invention provides a process that reduces the HF defect density in finished structures having at least a surface useful layer of semiconductor material, such as a layer of silicon or silicon-germanium (SiGe) which is less than 1000 Å thick. The term "finished" structure means a structure for which the surface of the semiconductor useful layer has undergone at least a chemical-mechanical polishing step and a step of cleaning the surface of the useful layer using an RCA treatment as described above. The polishing step may also be preceded or followed by a surface heat treatment such as sacrificial oxidation or rapid or slow thermal anneal.

As described in detail below, it has been found that by adding a cleaning step using an SC1 solution that is milder under its conditions of use (concentration, temperature) than conventional SC1 solutions, and that is conducted intermediately, i.e., between the chemical-mechanical polishing step and the RCA cleaning step proper, the resultant HF defect density in the finished structure can be significantly reduced.

The intermediate step contributes to removing contaminants and minor defects, possibly polishing residues produced during the chemical-mechanical polishing step, and especially those produced with the use of a suspension of a chemical agent with abrasive particles (i.e., metallic contamination). The contaminants and small defects act as "catalysts" in the emergence of HF defects during subsequent treatments. The contaminants and small defects appear to constitute preferential locations for etching during the step of cleaning the surface of the semiconductor useful layer by RCA treatment and result in the emergence of such defects. The defects may pass through the thin semiconductor layer and emerge into buried layers (e.g., an oxide layer) during RCA treatment (these defects are termed HF defects since they can be revealed with HF) or are capable of emerging during a subsequent treatment, such as sacrificial oxidation.

Thus, by controlling (i.e., reducing) the degree of etching of the SC1 solution (using a milder SC1 solution) during the intermediate cleaning step, it is possible, prior to the standard RCA cleaning step, to eliminate contaminants and to passivate minor defects from which HF defects would otherwise develop, without etching the semiconductor useful layer. This results in a surface layer with significantly reduced HF defects compared to one that is processed with a conventional SC1 solution.

The degree of etching of the milder SC1 solution used in the intermediate cleaning step of the invention is mainly controlled by adjusting the concentrations of the components of the SC1 solution and its temperature. The intermediate cleaning step of the invention must allow elimination of contaminants and passivate minor defects to avoid the emergence of HF defects without, however, attacking the semiconductor useful layer. If the conditions of use of the SC1 solution (i.e., concentrations of constituents and temperature) endow it with too great a degree of etching, there is a risk of etching the useful layer too deeply and causing additional defects in that layer. In other words, the concentration of additive in the SC1 solution and its operating temperature must be reduced relative to the usual conditions for using SC1 solutions in RCA cleaning, but only down to a certain limit, below which the intermediate cleaning step does not have any sufficient effect (i.e., it can no longer eliminate significant numbers of minor defects and contaminants or residues derived from chemical-mechanical polishing). In the light of the examples given below, the skilled person will be able to adjust the concentration and temperature conditions for the SC1 solution during the intermediate cleaning step to treat the surface of the useful layer of semiconductor material.

In known manner, a conventional SC1 solution contains ammonium hydroxide ($NH_4OH$), hydrogen peroxide ($H_2O_2$), and deionized water ($H_2O$). In accordance with the invention, the formulation for the milder SC1 solution is as follows:

1 volume of ammonium hydroxide ($NH_4OH$);
4 volumes of hydrogen peroxide ($H_2O_2$); and
10 to 40 volumes of deionized water ($H_2O$).

Compared to conventional SC1 solutions, this represents a reduction in the amount of ammonium hydroxide by volume by about 40% to about 85%, and a reduction in the amount of hydrogen peroxide by volume of by about 5% to about 10%. Also, the reduction in concentration can by viewed as an increase in water content of from 5% to about 25% by volume. Preferred reductions in concentration include a reduction in ammonium hydroxide by volume by about 50% to about 75%, and a reduction in the amount of hydrogen peroxide by volume of by about 5% to about 7.5% and an increase in water content of from 10% to about 20% by volume.

The operating temperature of the SC1 solution in the intermediate cleaning step of the invention must not exceed about 50° C. The solution is preferably used at ambient temperature, which avoids having to use to heating means and simplifies control of the intermediate cleaning step. In known manner, an increase in the temperature of the solution causes an increase in its degree of etching (activation).

As an example, at ambient temperature, taken to be a reference value of 20° C.±5° C., a milder SC1 solution containing 1 volume of $NH_4OH$, 4 volumes of $H_2O_2$, and 20 volumes of $H_2O$ provides good HF defect reduction capacity while minimizing etching of the semiconductor layer. However, an SC1 solution containing 15 volumes of $H_2O$ also provides good results, as does an SC1 solution containing 30 volumes of $H_2O$ at ambient temperature.

Further, the time necessary for application of the milder SC1 solution is about 1 minute.

In a first implementation of the invention, the intermediate cleaning step is carried out by immersing the wafer having the semiconductor useful layer in SC1 solution having the formulation described above. The SC1 solution is preferably at ambient temperature and the immersion time is about 1 minute.

In a further implementation of the invention, a polishing unit is employed to carry out the intermediate cleaning step with the milder SC1 solution. FIG. 1 shows a polishing unit 10 which comprises a polishing head 11 into which a substrate is inserted, such as an SOI substrate 12 comprising an insulating support 120 and a layer of silicon 121 as the semiconductor useful layer. The unit 10 further comprises a plate 13 and a polishing pad 14. In accordance with the invention, a line 15, normally used to dispense abrasive suspension into the head, is used to dispense the milder SC1 solution. A pressure Fe and motion symbolized by arrow 16 are applied to the head to ensure contact of the whole surface of the layer of silicon 121 with the milder SC1 solution.

Figure 2:
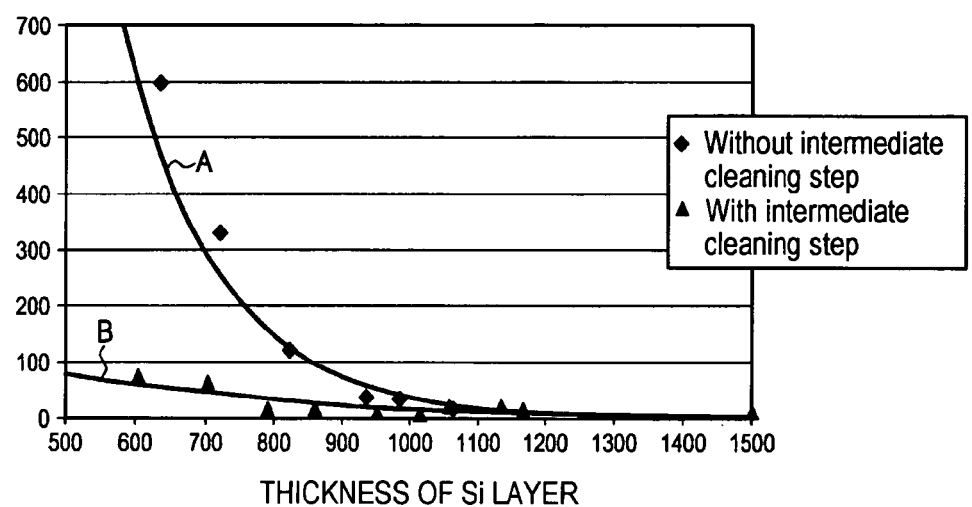
FIG. 2 is a graph showing the effect of the intermediate cleaning step on silicon layers of different thicknesses.

FIG. 2 shows the results obtained as regards the reduction of HF defects in layers of silicon when carrying out the intermediate cleaning step using the milder SC1 solution of the invention, such as a milder SC1 solution containing 1 volume of $NH_4OH$, 4 volumes of $H_2O_2$ and 20 volumes of $H_2O$ at ambient temperature.

In FIG. 2, curves A and B represent the number of HF defects on a 200 millimeter (mm) wafer, i.e., over a surface area of 314 $cm^2$, observed on layers of silicon that have undergone chemical-mechanical polishing and RCA cleaning respectively, both with no intermediate cleaning step using the milder SC1 solution (curve A), and with the intermediate cleaning step using the milder SC1 solution (curve B). It will be observed that the HF defect density is linked to the thickness of the layer of silicon, curves A and B showing results where the HF defects have been revealed after thinning to the thicknesses of the layers of silicon the value of which is shown along the abscissa. This observation establishes that the HF defects observed in wafers treated using the prior art method (i.e., chemical-mechanical polishing directly followed by standard RCA treatment with no intermediate cleaning step) result in the presence of non emergent defects in the thicker layer. The defects are transformed into HF defects during thinning of the layer.

As can be seen in FIG. 2, the HF defect density in the layers of silicon is considerably reduced when an additional cleaning step in accordance with the invention (see curve B) is carried out compared with the same layers which have not undergone intermediate cleaning (see curve A). The impact of the intermediate cleaning step on the reduction of the HF defect density becomes significant for layers which are less than 1000 Å thick; and the smaller the thickness, the greater the effect.

The intermediate cleaning step of the invention as described above can minimize defects in a layer of semiconductor material that has undergone a chemical-mechanical polishing step followed by an RCA cleaning step. As a result, the present invention is applicable to wafers of semiconductor materials alone (e.g., silicon or silicon-germanium) or to multilayer wafers having a surface layer constituted by a layer of semiconductor material.

The intermediate cleaning step of the invention as described above can in particular significantly reduce the HF defect density in SOI (or SGOI) structures typically comprising a surface layer of semiconductor material, such as silicon (or a silicon-germanium alloy) having a thickness of less than 1000 Å, which structures are fabricated using the SMART-CUT® technique, i.e., by transfer (after implantation and cleavage) of a fine layer of semiconductor material onto an insulating support, necessitating steps of chemical-mechanical polishing and RCA cleaning of the surface of the transferred layer of semiconductor.

What is claimed is:

1. A method of treating a wafer having at least a surface layer of a semiconductor material, which comprises subjecting the surface of the surface layer to a chemical-mechanical polishing step, conducting an intermediate step of cleaning the surface of the surface layer of semiconductor material using an SC1 solution under concentration and temperature conditions that allow the emergence of defects in the surface layer to be reduced compared with a similar surface layer which has not undergone the intermediate cleaning step, and thereafter subjecting the surface layer to an RCA cleaning step, wherein a reduced amount of HF defects are obtained compared to the same treatment of a similar surface layer but without the intermediate cleaning step.

2. The method of claim 1, wherein the SC1 solution contains ammonium hydroxide ($NH_4OH$), hydrogen peroxide ($H_2O_2$) and deionized water ($H_2O$) but that has a reduced etching ability compared to a conventional SC1 solution in order to reduce the emergence of defects in the surface layer compared to those obtained in a similar surface layer wafer that is treated with a conventional SC1 solution.

3. The method of claim 2, wherein the SC1 solution has a reduction in ammonium hydroxide concentration by volume by about 50% to about 75%, and a reduction in of hydrogen peroxide concentration by volume of by about 5% to about 7.5% or an increase in water content of from 10% to about 20% by volume.

4. The method of claim 2, wherein the SC1 solution comprises 1 volume of ammonium hydroxide ($NH_4OH$), 4 volumes of hydrogen peroxide ($H_2O_2$), and between 10 to 40 volumes of deionized water ($H_2O$), with the SC1 solution being utilized at a temperature of 20° C.±5° C.

5. The method of claim 4, wherein the intermediate cleaning step is carried out for about 1 minute.

6. The method of claim 1, wherein the intermediate cleaning step is carried out by immersing the wafer in an SC1 solution.

7. The method of claim 1, wherein the intermediate cleaning step is carried out using a polishing unit comprising a polishing head for holding the wafer, with the surface of the surface layer of semiconductor material of the wafer also being held in contact with a plate, and with the polishing unit including an injection line via which the SC1 solution is dispensed onto the surface of the surface layer.

8. The method of claim 1, wherein the surface layer of semiconductor material is less than 1000 Å thick.

9. The method of claim 1, wherein the surface layer of semiconductor material is made of silicon (Si) or silicon germanium (SiGe).

10. The method of claim 9, wherein the wafer is a silicon on insulator (SOI) structure or a silicon-germanium on insulator (GGOI) structure.

11. In the surface treatment processing of a wafer having a surface layer of a semiconductor material, the improvement which comprises conducting an intermediate cleaning step utilizing an SC1 solution that contains ammonium hydroxide ($NH_4OH$), hydrogen peroxide ($H_2O_2$) and deionized water ($H_2O$) but that has a reduced etching ability compared to a conventional SC1 solution in order to reduce the emergence of defects in the surface layer compared to those obtained in a similar surface layer wafer that is treated with a conventional SC1 solution.

12. The process of claim 11, wherein the SC1 solution includes conventional components of reduced concentration compared to a conventional SC1 solution, but with those concentrations being sufficient to eliminate contaminants and to passivate minor defects to avoid the emergence of HF defects while not attacking the surface layer of semiconductor material.

13. The process of claim 12, wherein the SC1 solution has a reduction in ammonium hydroxide concentration by volume by about 50% to about 75%, and a reduction in of hydrogen peroxide concentration by volume of by about 5% to about 7.5% or an increase in water content of from 10% to about 20% by volume.

14. The process of claim 11, wherein the SC1 solution includes conventional components applied at a reduced temperature or for a shorter time compared to a conventional SC1 solution, but with the temperature and time being sufficient to allow the components to eliminate contaminants and to passivate minor defects to avoid the emergence of HF defects while not attacking the surface layer of semiconductor material.

15. The process of claim 14, wherein the temperature is about 20° C.±5° C. and the cleaning step is conducted for about 1 minute.

* * * * *

UNITED STATES PATENT AND TRADEMARK OFFICE
CERTIFICATE OF CORRECTION

PATENT NO. : 7,312,153 B2 Page 1 of 1
APPLICATION NO. : 11/256348
DATED : December 25, 2007
INVENTOR(S) : Coletti et al.

It is certified that error appears in the above-identified patent and that said Letters Patent is hereby corrected as shown below:

<u>Title Page</u>:
Item (56) References Cited, OTHER PUBLICATIONS, A.J. Auberton-Heré et al. reference, change "Auberton-Heré" to -- Auberton-Hervé --.

<u>Column 6</u>:
Line 48 (claim 3, line 3), after "reduction in", delete "of".

<u>Column 8</u>:
Line 7 (claim 13, line 3), after "reduction in", delete "of".

Signed and Sealed this

Twenty-seventh Day of May, 2008

JON W. DUDAS
*Director of the United States Patent and Trademark Office*